United States Patent [19]
Jungert

[11] Patent Number: 5,034,637
[45] Date of Patent: Jul. 23, 1991

[54] PUSH-PULL OUTPUT STAGE OF INTEGRATED CIRCUIT FOR REDUCING GROUND BOUNCE NOISE

[75] Inventor: Horst A. Jungert, Buch am Eribach, Fed. Rep. of Germany

[73] Assignee: Texas Instruments Deutschland GmbH, Fed. Rep. of Germany

[21] Appl. No.: 481,006

[22] Filed: Feb. 15, 1990

[30] Foreign Application Priority Data

Feb. 17, 1989 [DE] Fed. Rep. of Germany ....... 3904910

[51] Int. Cl.$^5$ .................. H03K 3/013; H03K 5/13; H03K 17/28; H03K 17/687
[52] U.S. Cl. ..................................... 307/542; 307/443; 307/448; 307/473; 307/594; 307/596; 323/315
[58] Field of Search ............... 307/443, 542, 572, 448, 307/451, 452, 585, 552, 555, 558, 568, 592, 594, 597, 246, 263, 242; 323/312, 315

[56] References Cited

U.S. PATENT DOCUMENTS

| | | | |
|---|---|---|---|
| 4,771,195 | 9/1988 | Stein | 307/572 |
| 4,785,201 | 11/1988 | Martinez | 307/443 |
| 4,789,793 | 12/1988 | Ehni et al. | 307/303 |
| 4,820,942 | 4/1989 | Chan | 307/443 X |
| 4,885,485 | 12/1989 | Leake et al. | 307/443 X |
| 4,908,528 | 3/1990 | Huang | 307/443 |
| 4,918,339 | 4/1990 | Shigeo et al. | 307/263 X |
| 4,961,010 | 10/1990 | Davis | 307/542 X |

OTHER PUBLICATIONS

*Advanced CMOS Logic, Designers Handbook*, chapters 3.1.5, pp. 9–11, 1987.

Primary Examiner—Stanley D. Miller
Assistant Examiner—David R. Bertelson
Attorney, Agent, or Firm—William E. Hiller; N. Rhys Merrett; Melvin Sharp

[57] ABSTRACT

A push-pull output stage of an integrated circuit for generating a pulse-like output signal in dependence upon a pulse-like input signal. The integrated circuit of which the push-pull output stage is a part is susceptible to high switching speeds in which the pulse-like signal varies between high and low voltage levels. The push-pull output stage inhibits the overshoot of the pulse-like signal leading to inaccurate interpretation of the pulse-like signal as having a high voltage level when the pulse-like signal actually has a low voltage level. The output stage includes output field-effect transistors comprising two groups (12, 14) of parallel-connected subtransistors (TN1 to TNn, TP1 to TPn). The gate zones of the subtransistors in each respective group are connected together. To the gate zones of the subtransistors (TN1 to TNn) of at least one (12) of the two groups (12, 14) a current dissipating or grounding transistor (TS1) is connected. The current grounding transistor (TS1) is the output transistor of a current mirror circuit (TS1, TS2, TS3, TS4) which is made up solely of field-effect transistors and to the input transistor (TS2) of which a current dependent on the input signal is supplied for controlling the current grounding transistor (TS1).

5 Claims, 1 Drawing Sheet

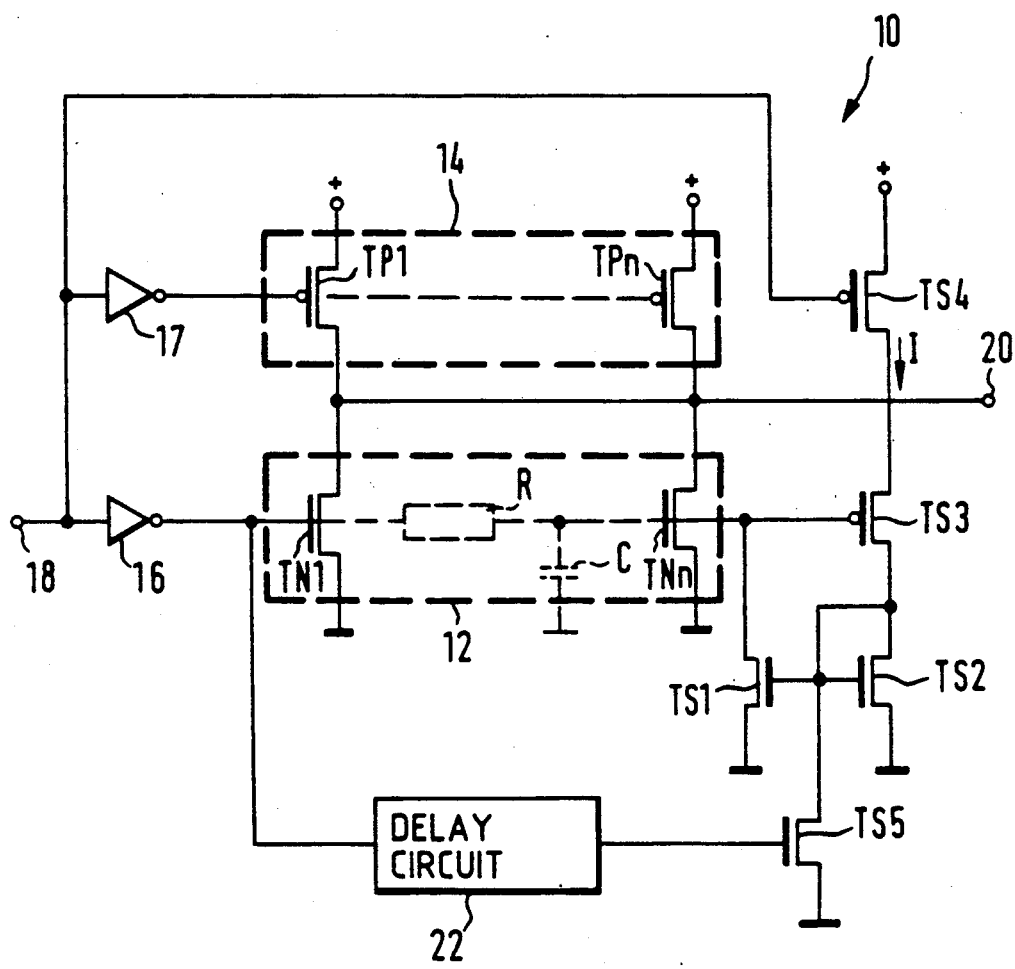

PUSH-PULL OUTPUT STAGE OF INTEGRATED CIRCUIT FOR REDUCING GROUND BOUNCE NOISE

BACKGROUND OF THE INVENTION

1. Field of the Invention

The invention relates to an integrated push-pull output stage for generating a pulse-like output signal in dependence upon a pulse-like input signal comprising output field-effect transistors which consist of two groups of parallel-connected subtransistors of which the gate zones are connected together, a current grounding transistor being connected to the connected gate zones of the subtransistors of at least one of the two groups.

2. Description of the Prior Art

In integrated semiconductor circuits which have been developed specifically for obtaining high switching speeds parasitic inductances of the supply lines to the active circuit elements have proved particularly disadvantageous because they prevent implementation of the theoretically possible high switching speeds in practice. In particular, in the output stages of integrated circuits in which relatively high currents flow, in the parasitic line inductances in highspeed switching operations, thus for example in high speed switching between a high voltage level and a low voltage level, high voltage peaks are generated which lead to a strong overshooting at the pulses furnished by the respective output stage. The overshooting can lead to erroneous output signals because particularly with a low signal value, which lies in the range of ground potential, an undesired increase of the potential occurs which by the subsequent circuit stages, in the most unfavourable case, leads to the signal furnished by the output stage being interpreted as a signal with high value due to the overshoot phenomena although it should actually be a signal with low value. This phenomenon is referred to in English usage as "ground bounce".

The overshoot can of course be reduced in that the switching edges of the pulse-like signals may be slower but this however is contrary to the objective of achieving high switching speeds. In the book published by the company Texas Instruments "Advanced CMOS Logic, Designers Handbook", which came out in 1987, in chapter 3.1.5, page 3-9 an output stage is described in which steps are taken to reduce the unfavourable overshoot. In this output stage the output transistors are each formed from a plurality of individual transistors which are connected in parallel with each other. The gate zones of said individual transistors are connected in series and act like a resistive line. Since this line also has a certain capacitance the series circuit of the gate zones acts like a delay line so that the signal from the first transistor to the last transistor of the parallel-connected individual transistors requires a certain travelling time. However, without special measures this delay is not large enough to slow the edges of the switching pulses down to such an extent that undesirable overshoots no longer occur. The particular measure for reducing the overshoots includes in this known output stage the use of a current grounding or dissipating transistor which is connected to the series circuit of the gate zones of the output transistors of one of the two groups of individual transistors in the push-pull output stage and in the switched-on state causes a current to flow through the series circuit of the gate zones to ground.

The flowing of the current through the series circuit of the gate zones results in voltage drops occurring at the individual gate zones which act like individual resistances so that the gate voltages diminish consecutively from the first transistor of the group to the last. Due to the voltage drops occurring at the individual gate zones this additional current through the series circuit of the gate zones caused by the current grounding transistor opposes the formation of the overshoots. The current dissipating or grounding transistor must however be rendered nonconductive again after a defined time to prevent current permanently flowing through the gate zones. This blocking is carried out in dependence upon the input signal of the output stage from which by means of a delay circuit a control signal is generated which after the delay generated by the delay circuit renders the current grounding transistor nonconductive again. In the most favourable case, i.e. when the production-inherent parameters of the output stage have good values, the delay circuit must keep the current grounding transistor conductive long enough for the current to flow through the series circuit of the gate zones long enough for the desired effect of the gate voltage reduction to be maintained for an adequately long time. This current flow and the resulting voltage drop at the gate zones is the condition necessary for the undesired overshoots to be greatly reduced. If however the production-inherent parameters of the integrated output stage have unfavourable values the travelling time of the signal through the gate zones is from the start already relatively long and consequently the current additionally caused by the current grounding transistor together with the resulting further increase of the travelling time leads to excessive slowing down of the edges of the output signal of the output stage and this is extremely undesirable because the current grounding transistor, although it is intended to reduce the overshoot, should not excessively slow down the edge steepness of the output pulses.

SUMMARY OF THE INVENTION

The invention is based on the problem of providing an integrated push-pull output stage in which with low circuit expenditure the overshoot at the pulses of the output signal is substantially reduced without appreciably impairing the switching speed of the output stage.

According to the invention this problem is solved in that the current grounding transistor is the output transistor of a current mirror circuit which is made up solely of field-effect transistors and to the input transistor of which a current depending on the input signal is supplied for controlling the current grounding transistor.

The invention will now be explained by way of example with reference to the drawings.

BRIEF DESCRIPTION OF THE DRAWINGS

The single FIGURE is a circuit diagram of a push-pull output stage of an integrated circuit according to the invention.

DESCRIPTION OF THE PREFERRED EMBODIMENT

The output stage 10 illustrated in the drawings contains output transistors each of which comprises a group of subtransistors connected in series. The group 12 contains a plurality of N-channel subtransistors TN1 to TNn which are connected in parallel with each other, their gate zones being connected respectively in series. The group 14 contains a plurality of P-channel substransistors TP1 to TPn which are connected together in the same manner as the subtransistors of the group 12. As can be seen a respective subtransistor of the one group is connected in series with a subtransistor of the other group, i.e. for example the TP1 with the TN1. From the circuitry point of view each group of subtransistors behave like an output transistor, the two groups being connected together in such a manner that a conventional push-pull output stage in CMOS technology results.

The input signal is supplied to the two branches of the push-pull output stage via respective inverters 16, 17. The connected inputs of the negators 16, 17 form the signal input 18. The signal output 20 is formed by the interconnected source and drain terminals of the subtransistors of the two groups 12, 14.

In the group 12 it is indicated in dashed lines that the series-connected gate zones of the subtransistors TN1 to TNn behave like a delay member with a series resistance R and a capacitance C.

Connected to the series-connected gate zones of the substransistors TN1 to TNn of the group 12 is a current grounding transistor TS1, the drain-source path of which lies behind the connected gate zones and ground. The current grounding transistor TS1 is part of a current mirror circuit to which in addition the transistors TS2, TS3 and TS4 belong. As can be seen from the circuit diagram these three last-mentioned transistors are connected in series. The gate zone of the transistor TS2 is connected to the gate zone of the current grounding transistor TS1 and there is a direct connection between the drain zone and the gate zone at the transistor TS2. The current grounding transistor TS1 and the transistor TS2 are N-channel transistors whilst the transistors TS3 and TS4 are P-channel transistors.

From the connecting point of the two gate zones of the transistors TS1 and TS2 the drain-source path of a further N-channel transistor TS5 leads to ground. Connected to the gate zone of the transistor TS5 is the output of a delay circuit 22, the input of which is connected to the output of the inverter 16. In the output stage illustrated in the drawings apart from the groups 12 and 14 forming the actual output transistors and comprising in each case a plurality of subtransistors only those circuit parts which contribute to the problem of overshoot in declining edges of the input signal are included, i.e. when the input signal is switched from a high signal value to a low signal value. Since it is precisely with declining edges that the undesired raising of the ground potential occurs due to the overshoot occurring, circuit measures must be taken in particular to improve the behaviour in this signal region. If however it is also desired to reduce the overshoot with rising edges a current mirror circuit corresponding to the current mirror circuit of the transistors TS1, TS2, TS3 and TS4 and a delay circuit corresponding to the delay circuit 22 and a transistor controlled thereby like the transistor TS5 could be associated with the group 14.

The output stage illustrated in the drawings operates as follows:

It will be assumed that to the signal input 18 a pulse-like signal is applied which has a high value and is switched to the low signal value. In the presence of the high signal value at the input 18 the transistor TS4 is nonconductive so that no current flows through the series circuit comprising the transistors TS4, TS3 and TS2. Due to the known properties of the current mirror circuit no current thus flows through the current grounding transistor TS1 because the transistors TS2 and TS1 have identical behaviour as regards the flow of current. At the output 20 the output stage likewise furnishes a signal with high value.

Now, when the input signal at the input 18 starts to switch to a low value the transistor TS4 is rendered conductive so that a current I flows therethrough. The current also flows through the transistor TS3 which is in the conductive state because a low voltage is at its gate electrode. The current I also flows through the transistor TS2 and this in turn leads to the same current I flowing through the transistor TS1. Simultaneously with the change of the signal value at the input 18 to the low value the signal at the output of the inverter 16 goes to a high value so that the subtransistors TN1 to TNn of the group 12 also become conductive. Due to the resistance of the series-connected gate zones of the subtransistors TN1 to TNn and the stray capacitance C which is present the subtransistors TN1 to TNn do not become conductive simultaneously, the subtransistor TNn becoming conductive later by an amount corresponding to the time constant resulting from the resistor R and the capacitor C. Due to the current flowing through the conductive current grounding transistor TS1, at the divided resistance R of the individual gate zones in each case a voltage drop is generated so that the effective gate voltages become consecutively progressively smaller from the subtransistor TN1 up to the subtransistor TNn. This acts like a slowing down of the declining edge of the input signal so that the overshoot of the pulse-shaped signal furnished at the output 20 is reduced in the region of the ground value. As soon as the voltage at the gate electrode of the transistor TS3 has risen to the high value immediately after the delay caused by the resistor R and the capacitor C the transistor TS3 is rendered nonconductive so that the current flow through the transistor TS2 is interrupted. As a result no current now flows through the current grounding transistor TS1 either so that in the static state, i.e. when the input signal does not undergo any change, no direct current flows in the output stage.

To ensure that in the output stage in the static state no direct current can flow the connection of the gate zones of the transistors TS1 and TS2 is applied via the transistor TS5 to ground as soon as the signal at the output of the delay circuit 22 has assumed a high value. The delay duration of the delay circuit 22 is set to a longer value than the travel time which results from the resistor R and the capacitor C in the series circuit of the gate zones of the transistors TN1 and TS3.

The current mirror circuit containing the current grounding transistor TS1 acts favourably on the overshoot behaviour when the production-inherent parameters of the output stage have optimal values and furthermore even when these parameters have extremely unfavourable values. In the former case the travel time of the signal from the gate zone of the transistor TN1 to the gate zone of the transistor TS3 due to the resistor R and the capacitor C is very short but because of the voltage drop caused by the current grounding transistor TS1 at the gate zones of the subtransistors TN1 to TNn the respective gate voltage at the subtransistors becomes consecutively smaller so that the overshoot is effectively opposed. The disconnection of the current grounding transistor TS1 takes place when the transistor TS3 is rendered nonconductive due to the rise of the voltage at its gate zone. In the case of the most unfavourable parameters a smaller current flows through the transistors TS4 and TS3 and this also results in a smaller current through the current grounding transistor TS1. As a result, at the gate zones of the subtransistors TN1 to TNn a smaller voltage drop takes place and consequently no unnecessary increase of the signal travelling time is effected. As in the case outlined above the current grounding transistor TS1 is rendered nonconductive as soon as due to the voltage rise at the gate zone of the transistor TS3 the latter transistor is blocked. In this case as well the delay circuit 22 again ensures that an unnecessary direct current in the output stage in the static state, i.e. with constant input voltage, is prevented.

I claim:

1. A push-pull output stage of an integrated circuit for generating a pulse-like output signal in dependence upon a pulse-like input signal susceptible to high switching speeds in which the pulse-like signal varies between high and low voltage levels while inhibiting the overshoot of the pulse-like signal leading to inaccurate interpretation of the pulse-like signal as having a high voltage level when the pulse-like signal actually has a low voltage level, said push-pull output stage comprising:

a first plurality of output field effect transistors having respective source and drain regions and gate electrodes extending therebetween, said first plurality of output field-effect transistors being connected in parallel and having their gate electrodes connected together to define a first group of subtransistors;

a second plurality of output field-effect transistors having respective source and drain regions and gate electrodes extending therebetween, said second plurality of output field-effect transistors being connected in parallel and having their gate electrodes connected together to define a second group of subtransistors;

each of said subtransistors of said first group of subtransistors being connected in series to the corresponding subtransistor of said second group of subtransistors;

said first and second groups of subtransistors being respectively provided with the input signal;

an output line connected between each subtransistor of said first group of subtransistors and the corresponding subtransistor of said second group of subtransistors and terminating in an output terminal;

a current grounding field-effect transistor having source and drain regions and a gate electrode extending therebetween connected to the connected gate electrodes of the subtransistors of at least one of the two groups of subtransistors;

a current mirror circuit including a plurality of serially connected field-effect transistors, one of said plurality of serially connected field-effect transistors of said current mirror circuit defining an input transistor and said current grounding field-effect transistor defining an output transistor of the current mirror circuit, the gate electrodes of said input and output transistors of said current mirror circuit being connected to each other; and said input transistor of said current mirror circuit being provided with a current dependent upon the input signal for controlling said current grounding field-effect transistor.

2. A push-pull output stage as set forth in claim 1, wherein said current mirror circuit includes a control field-effect transistor connected in series to said input transistor, said control transistor having source and drain regions and a gate electrode extending therebetween;

the gate electrode of said control transistor being connected to the gate electrodes of said at least one group of subtransistors and being responsive to the input signal for controlling the current supplied to said input transistor of said current mirror circuit.

3. A push-pull output stage as set forth in claim 2, wherein said current mirror circuit further includes a switching transistor connected in series with said control transistor and having source and drain regions and a gate electrode extending therebetween; and the gate electrode of said switching transistor receiving the input signal such that said switching transistor is responsible for controlling the current flowing through said current mirror circuit to said control transistor and said input transistor of said current mirror circuit.

4. A push-pull output stage as set forth in claim 1, wherein the second plurality of output field-effect transistors defining said second group of subtransistors are of opposite channel polarity with respect to the channel polarity of said first plurality of output field-effect transistors defining said first group of subtransistors.

5. A push-pull output stage as set forth in claim 3, further including a delay circuit connected to the input of said at least one group of subtransistors for receiving the input signal;

a ground-connected field-effect transistor having source and drain regions and a gate electrode extending therebetween, one of said source and drain regions of sasid ground-connected transistor being connected between the gate electrodes of said input and output transistors of said current mirror circuit; and said delay circuit having an output connected to the gate electrode of said ground-connected transistor;

the connection between the gate electrodes of said input and output transistors of said current mirror circuit being applied via the ground-connected transistor to ground in response to the signal at the output of said delay circuit assuming a high voltage value rendering said ground-connected transistor conductive.

* * * * *